(12) United States Patent
Montemezzo

(10) Patent No.: US 9,692,407 B2
(45) Date of Patent: Jun. 27, 2017

(54) CIRCUIT AND METHOD FOR DETECTION OF FAILURE OF THE DRIVER SIGNAL FOR PARALLEL ELECTRONIC SWITCHES

(71) Applicant: ABB Technology AG, Zurich (CH)

(72) Inventor: Thomas Montemezzo, Montevarchi (IT)

(73) Assignee: ABB Technology AG, Zurich (CH)

( * ) Notice: Subject to any disclaimer, the term of this patent is extended or adjusted under 35 U.S.C. 154(b) by 196 days.

(21) Appl. No.: 14/766,564

(22) PCT Filed: Feb. 11, 2013

(86) PCT No.: PCT/IT2013/000043
§ 371 (c)(1),
(2) Date: Aug. 7, 2015

(87) PCT Pub. No.: WO2014/122679
PCT Pub. Date: Aug. 14, 2014

(65) Prior Publication Data
US 2015/0372670 A1    Dec. 24, 2015

(51) Int. Cl.
*H03K 17/082* (2006.01)
*H03K 17/18* (2006.01)
*G01R 31/327* (2006.01)
*H03K 17/12* (2006.01)

(52) U.S. Cl.
CPC ....... *H03K 17/082* (2013.01); *G01R 31/3277* (2013.01); *H03K 17/0828* (2013.01); *H03K 17/18* (2013.01); *H03K 17/127* (2013.01); *Y10T 307/76* (2015.04)

(58) Field of Classification Search
CPC .. G01R 31/3277; H03K 17/127; Y10T 307/76
USPC ........................................................ 307/113
See application file for complete search history.

(56) References Cited

U.S. PATENT DOCUMENTS

2011/0278918 A1    11/2011    Shindo et al.

FOREIGN PATENT DOCUMENTS

WO    2013093408    6/2013

OTHER PUBLICATIONS

International Search Report prepared by the European Patent Office regarding PCT/IT2013/000043, dated Oct. 3, 2013.

*Primary Examiner* — Robert Deberadinis
(74) *Attorney, Agent, or Firm* — Patterson Intellectual Property Law, P.C.; Mark J. Patterson

(57) ABSTRACT

There is described a method for driving paralleled electronic switches via a drive signal processing circuit (1) connected to respective driver circuits (5A, 5B) associated with said electronic switches (7 A, 7B). During the turn-off intervals of the electronic switch, the driver circuit sends a fault signal to the drive signal processing circuit. During the turn-off intervals of the electronic switch, the driver circuit masks the fault signal coming from the drive circuit of the electronic switch.

21 Claims, 5 Drawing Sheets

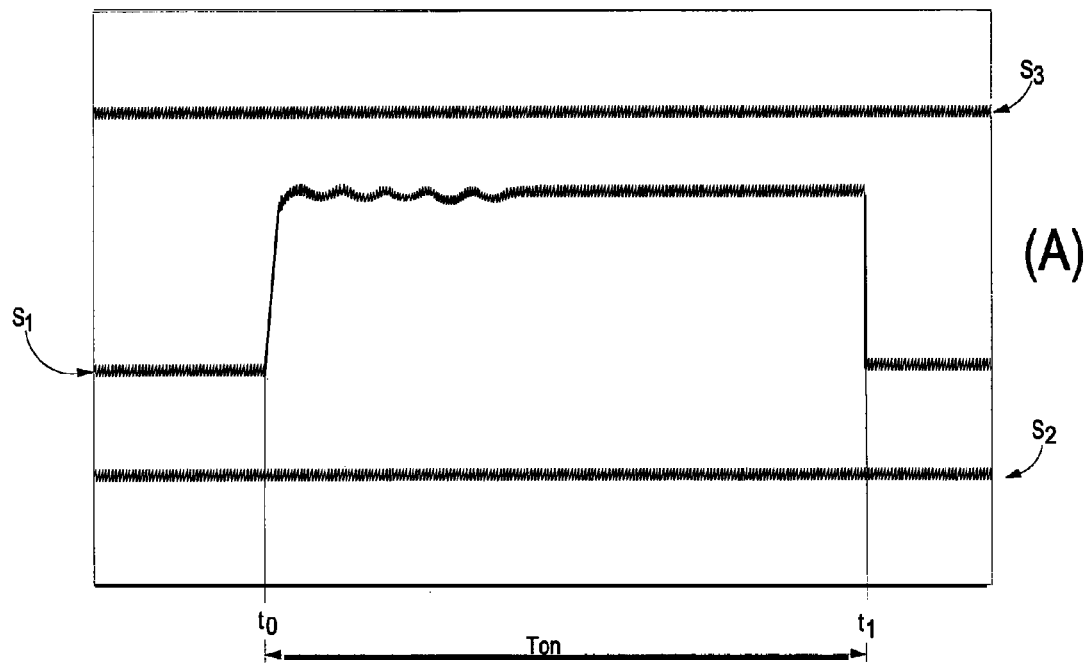
(A)
Fig.3
STATE OF THE ART
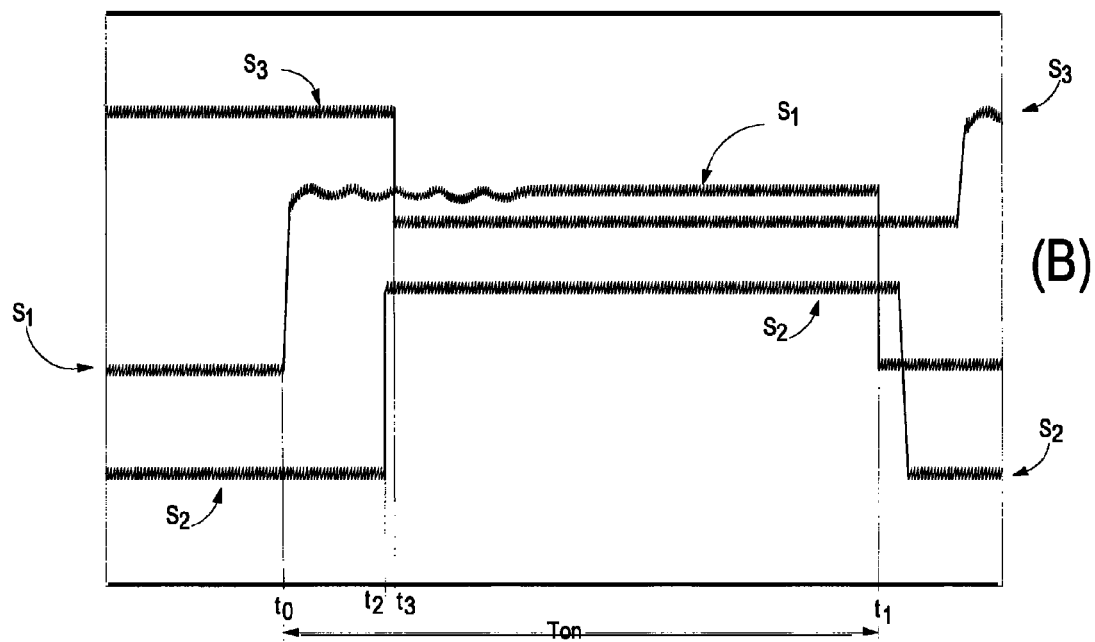
(B)

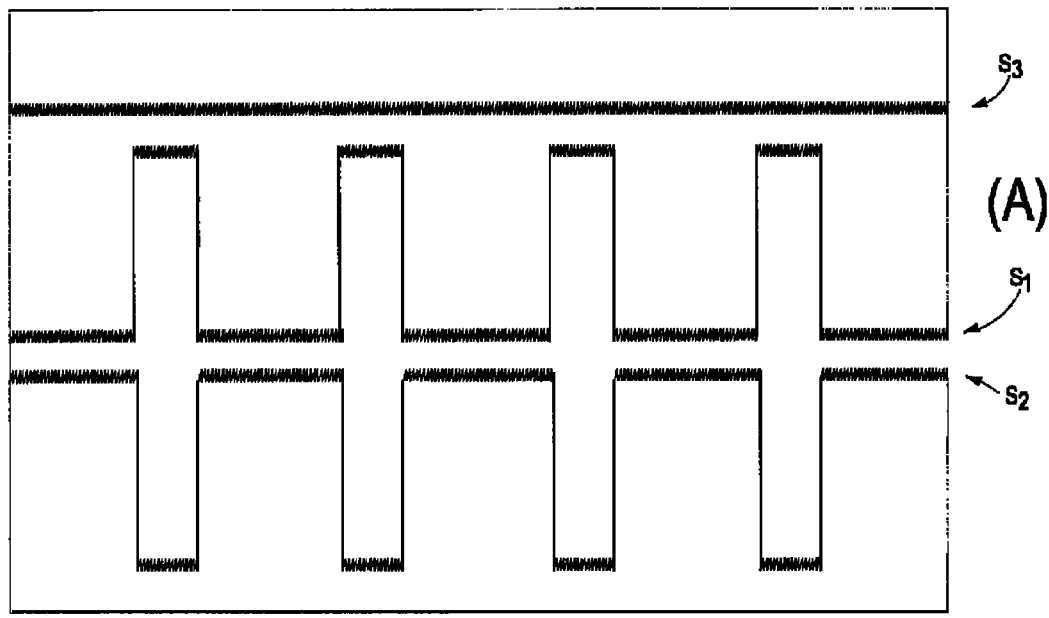
Fig.4
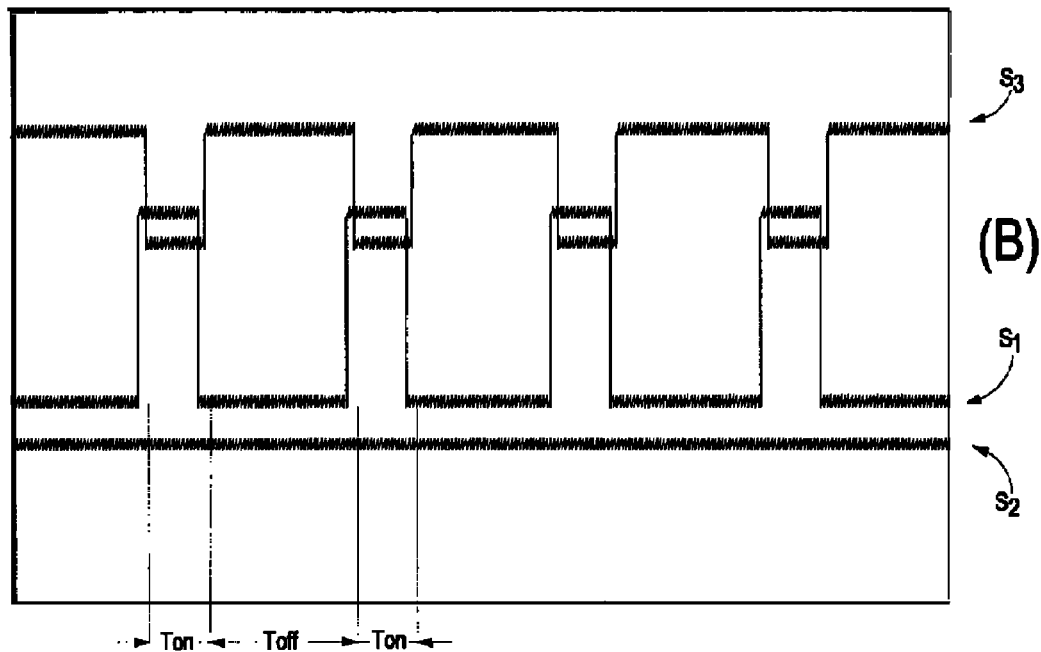

CIRCUIT AND METHOD FOR DETECTION OF FAILURE OF THE DRIVER SIGNAL FOR PARALLEL ELECTRONIC SWITCHES

TECHNICAL FIELD

The present invention relates to circuits for driving switches, with a drive signal, for example a PWM signal. Circuits of this type are used in a wide range of electronic devices, for example when it is necessary to condition electrical energy coming from a power distribution network to use it to supply electrical machinery. Electrical energy conditioning circuits can also be used to condition electrical energy coming, for example, from a direct current source, such as a renewable source, to inject it into an electrical distribution network, or to supply a load.

Typically, circuits of this type are found in current inverters or in current converters.

BACKGROUND ART

Electronic switches, typically IGBT or other similar electronic components, are sized for a given maximum current load or current rating. When it is required to provide a device capable of delivering a power such that the current exceeds the current rating on a single switch, there are provided arrangements of electronic switches in parallel, so as to split the current delivered between two or more switches rather than only one. The switches in parallel are driven by the same drive signal, for example a PWM signal. Therefore, half-bridge or full-bridge configurations are, for example, possible, where in each branch of the bridge there are provided two or more electronic switches, controlled by the same drive signal. Each electronic switch is associated with a respective driver circuit or board.

The drive signal of the electronic switches is generated by a drive signal processing circuit or processing board, typically a DSP (Digital Signal Processor). The drive signal processing circuit is connected to each drive circuit of the various electronic switches via a drive line, through which the drive signal is transmitted. Moreover, each driver circuit is connected to the drive signal processing circuit with a fault line. If a fault occurs in the electronic switch associated with a given driver circuit, the driver circuit sends a fault signal via the fault line to the drive signal processing circuit, so that, for example, the device is switched off and/or an alarm signal is emitted. The fault in the electronic switch can result from various causes. In general, the fault causes an increased voltage drop across the electronic switch. When said voltage drop exceeds a threshold value, the driver circuit generates a fault signal on the fault line.

If a fault or interruption occurs on the drive line, via which the drive signal processing circuit delivers the drive signal to the driver circuit, the respective electronic switch remains open, as it no longer receives the switching signal. When this occurs, the flow of current, which in normal operating conditions is split between the N electronic switches in parallel, is split between N−1 switches, with a consequent increase in the current rate through each remaining switch. For example, in the case of a configuration with two switches in parallel, if a fault occurs in the drive line associated with one of the electronic switches, this latter will no longer switch in closed conditions and will remain constantly open. The other switch will sustain the whole current flow in the conduction intervals. If the current exceeds the maximum allowable value on the electronic circuit, this will break. A situation of absence of drive signal is not detected by the driver circuit and therefore no alarm condition occurs. The device continues to operate until the electronic switch, which continues to receive the drive signal, is irreversibly damaged.

Therefore, there is a need to improve the reliability of devices of the type described above and in particular to verify any interruptions or malfunctioning of the drive line, to prevent irreversible damages to electronic switches. It is advisable for this function to be performed without burdening the circuits, i.e. without the need to provide additional connection lines between the drive signal processing circuit and each driver circuit of the respective electronic switch.

SUMMARY OF THE INVENTION

To solve or alleviate one or more of the problems of prior art devices, there is provided a drive signal processing circuit and a fault line between the drive signal processing circuit and the respective driver circuit of the respective switch. Moreover, a fault signal is present on the fault line not only in the case in which if there is effectively a fault in the controlled switch, but also when the drive signal received from the driver circuit assumes a turn-off value. During the intervals in which the drive signal processing circuit generates a turn-off signal, the fault signal is inhibited, i.e. masked, so that it does not give rise to a fault signal. If the fault signal remains also during the conduction interval, i.e. during the interval in which the drive signal processing circuit generates a conduction signal, the fault signal, no longer inhibited or masked, determines signaling of a fault, determined by the fact that the driver circuit does not receive the closing, i.e. turn-on, signal of the respective switch, for example due to an interruption of the drive line.

In practical embodiments, there is therefore provided a device for driving electronic switches in parallel, comprising a drive signal processing circuit, configured to send a drive signal to two or more electronic switches in parallel, said drive signal being able to assume at least a turn-on value and a turn-off value. The device can also comprise a driver circuit for each electronic switch, configured to receive a drive signal from the drive signal processing circuit and to control closing and opening of the respective electronic switch as a function of the value of the drive signal. Moreover, a drive line connects the drive signal processing circuit to the respective circuit of the electronic switch, to transmit the drive signal from an output of the drive signal processing circuit to an input of the respective driver circuit. Finally, a fault line is provided between the respective driver circuit and the drive signal processing circuit, to transmit a fault signal from the respective driver circuit to the drive signal processing circuit.

Each driver circuit also comprises an arrangement for generating a fault signal, to generate a fault signal on the fault line both when the drive signal input to the drive circuit assumes a turn-off value, and when there is a fault in the respective electronic switch. The drive signal processing circuit comprises an arrangement for masking or inhibiting the fault signal from the respective driver circuit during the intervals in which the drive signal output from the drive signal processing circuit assumes the turn-off value.

The fault signal is masked or inhibited in the sense that it does not determine the action (for example signaling of a fault or turning-off the device), which occurs in the case of an effective fault, i.e. in the case in which the drive signal processing circuit is generating a closing signal, i.e. a conduction signal for the respective switch, but the driver circuit of this latter does not receive the conduction signal.

In some embodiments, the arrangement for generating a fault signal comprises a fault signal generating circuit including an electronic changeover switch, connected to the fault line, driven so as to switch the voltage on the fault line so that:

the voltage on the fault line is equal to a value indicative of a fault situation when the drive signal input to the driver circuit assumes the turn-off value, or when there is a fault in the respective electronic switch;

the voltage on the fault line is equal to a value indicative of a correct operating condition when the drive signal input to the driver circuit assumes the turn-on value and the electronic switch is operating correctly.

In practical embodiments, the electronic changeover switch of the arrangement for generating a fault signal is associated with a delay network, to delay switching of the electronic changeover switch with respect to a rising edge of the drive signal.

In some embodiments, the electronic changeover switch of the arrangement for generating a fault signal is configured so as to apply, on the fault line, a high voltage value indicative of a fault signal, or a low voltage value indicative of the absence of a fault.

The fault signal generating circuit can comprise a connection branch, which connects the drive signal input to the electronic changeover switch, so that the voltage value on the drive signal input acts on the switching state of the electronic changeover switch. Moreover, the connection branch can comprise a switch, which is closed when the drive signal assumes the turn-off value and is opened when the drive signal assumes the turn-on value. In some embodiments, the switch of the connection branch is arranged and configured to apply a low voltage at the base of the changeover switch of the fault signal generating circuit when the drive signal assumes the turn-off value, said low voltage causing closing of the electronic changeover switch of the fault signal generating circuit and application of a fault signal on the fault line.

In advantageous embodiments, the electronic changeover switch of the fault signal generating circuit is connected to a fault signal input of the electronic switch driven by the driver circuit. The configuration can be such that the fault signal of the electronic changeover switch causes switching of the electronic switch of the fault signal generating circuit such as to apply a fault signal to the fault line.

In some embodiments, the fault condition of the electronic switch can be detected via a signal of over-voltage across the electronic switch.

In some embodiments, the drive signal processing circuit can comprise a terminal connected to the fault line via a fault signaling changeover switch. The switching state of this latter can be determined as a function of the presence or absence of a fault signal on the fault line. Advantageously, the arrangement to mask the fault signal can be configured to mask the signal delivered by the fault line to the fault signaling changeover switch when the drive signal assumes the turn-off value. In some embodiments, the fault signaling changeover switch has a gate connected to a node connected to the fault line and to a fault signal inhibition circuit, which brings the node to a voltage value corresponding to an absence of fault signal during the intervals in which the drive signal assumes the turn-off value. For example, the inhibition circuit can comprise an arrangement of electronic switches, which bring the node to a low voltage value during the intervals in which the drive signal assumes the turn-off value.

In some embodiments, the fault signal inhibition circuit can comprise a delay network, configured and arranged to extend the inhibition effect of the circuit with respect to the switching edge of the drive signal from the turn-off value to the turn-on value.

According to a further aspect, there is provided a method for driving electronic switches in parallel via a drive signal processing circuit connected to respective driver circuits associated with said electronic switches, wherein during the turn-off intervals of the electronic switch, the driver circuit sends a fault signal to the drive signal processing circuit, and wherein during said turn-off intervals of the electronic switch, the drive signal processing circuit masks the fault signal coming from the driver circuit of the electronic switch.

BRIEF DESCRIPTION OF THE DRAWINGS

The present invention will be better understood based on the description and accompanying drawing, which shows a non-limiting practical embodiment of the invention. More in particular, in the drawing:

FIGS. 3 to 5 show the shape of the drive and fault signals in different configurations and operating situations.

DETAILED DESCRIPTION OF AN EMBODIMENT OF THE INVENTION

Figure 1:
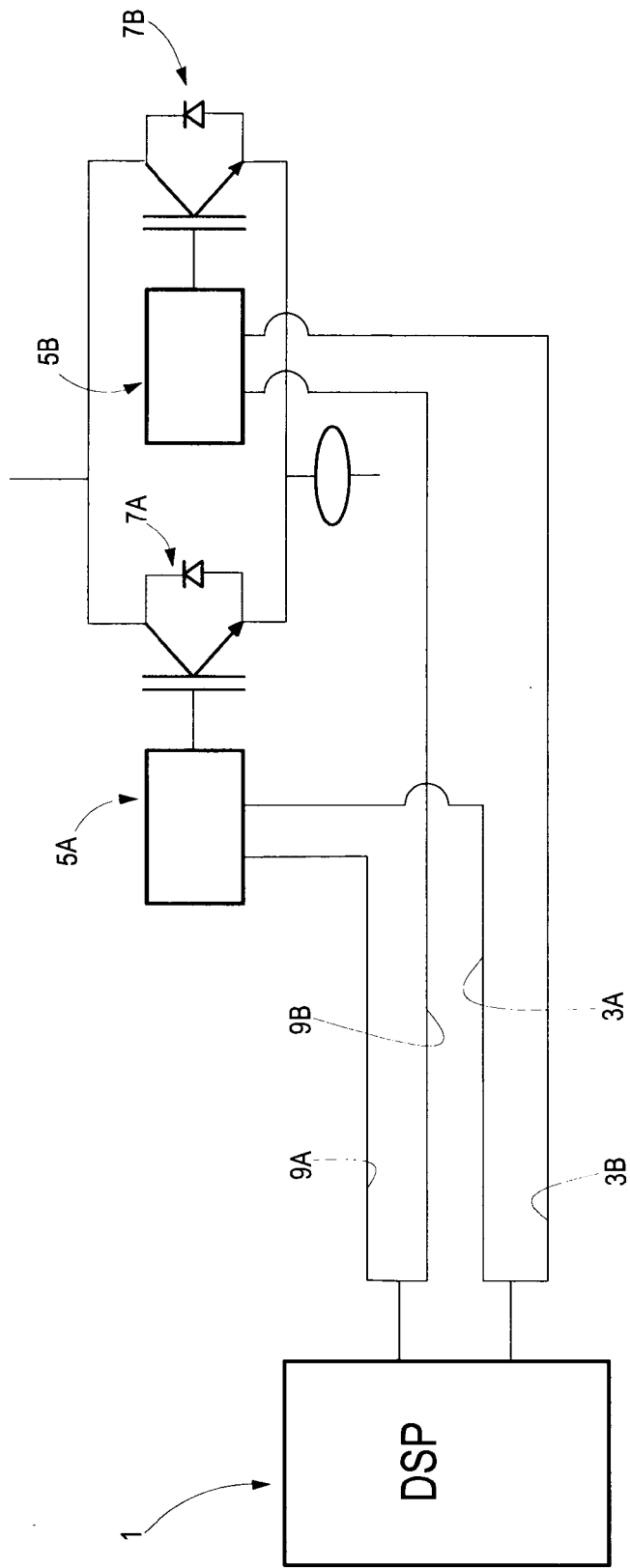
FIG. 1 shows a block diagram of a drive signal processing circuit connected to two driver circuits of two electronic switches in parallel.

The following detailed description of exemplary embodiments refers to the accompanying drawings. The same reference numerals in different drawings identify identical or similar elements. Moreover, the drawings are not necessarily to scale. The detailed description below does not limit the invention. Instead, the scope of the invention is defined by the appended claims.

Reference throughout the description to "an embodiment" or "the embodiment" or "some embodiments" means that a particular feature, structure or element described in relation to an embodiment is comprised in at least one embodiment of the subject described. Therefore, the phrase "in one embodiment" or "in the embodiment" or "in some embodiments" in various points throughout the description does not necessarily refer to the same embodiment or embodiments. Moreover, the particular features, structures or elements can be combined in any suitable manner in one or more embodiments.

FIG. 1 schematically illustrates a functional block diagram showing the main components of a device comprising a drive signal processing board or circuit for two electronic switches in parallel. The system described can be part of a more complex device, for example an inverter or a converter, comprising several pairs of electronic switches in a full-bridge or half-bridge arrangement. As the principles and the innovative elements described herein have a general scope and can be employed in any situation in which a drive signal processing circuit is used to drive two or more paralleled electronic switches, the details and further particulars of the more general device into which the paralleled switches are inserted do not require to be described. It is sufficient to mention that what will be described here below can be applied in general each time it is necessary to drive two or more paralleled electronic switches via drive signals generated by a processing circuit.

In the example illustrated, two paralleled electronic switches are provided. It must also be understood that the concepts described below can also be applied in systems with any number of switches in parallel.

In the diagram of FIG. 1, reference numeral 1 indicates the drive signal processing circuit as a whole. The circuit 1 can, for example, be a DSP (Digital Signal Processor). Hereinafter, for the sake of brevity, the drive signal processing circuit will also be indicated simply as DSP.

The DSP 1 is connected via respective drive lines 3A, 3B to two driver circuits 5A, 5B of two electronic switches in parallel 7A, 7B. The electronic switches 7A, 7B can, for example, be IGBTs or other semiconductor components of functionally similar type. The specific nature of the switches 7A, 7B is not binding and these can be selected, for example, on the basis of the type of function they are to perform.

Each driver circuit 5A, 5B is connected to the DPS 1 also via a respective fault line 9A, 9B which is used to transmit a fault signal from the driver circuit to the DSP.

The configuration described so far no different from the state of the art. A drive signal is sent on the drive lines 3A, 3B from the DSP 1 to control simultaneous opening and closing of the electronic switches 7A, 7B. As mentioned above, as the electronic switches 7A, 7B are in parallel, they must be driven by the same signal and therefore they open and close simultaneously. This is represented schematically by the fact that the two drive lines 3A, 3B are connected to each other on the side of the DPS 1.

In a manner known per se, the driver circuits 5A, 5B can be galvanically isolated with respect to the electronic switches 7A, 7B and can control opening and closing thereof via an optical signal generated by a photodiode. Any fault of the electronic switch 7A or 7B is detected by means of a voltage drop detector across said controlled switch. If the voltage drop across the controlled switch exceeds a threshold value, the respective driver circuit 5A, 5B generates a fault signal on the respective fault line 9A, 9B.

FIGS. 3(A) and 3(B) show the signals on the fault line (9A or 9B) and the drive signal on the drive line (3A or 3B) in a configuration known according to the state of the art. More in particular, the curve S1 represents the drive signal. The curve S2 indicates the fault signal on the fault line 9A or 9B and the curve S3 indicates the fault signal received by the DSP on a fault terminal thereof. In the diagrams of FIGS. 3(A) and 3(B) the voltage level of the respective signals is indicated on the ordinates, while the time is indicated on the abscissas.

FIG. 3(A) shows a situation of correct operation. The turn-on signal of the electronic switch (7A or 7B) is transmitted at the instant t0 on the drive line 3A. At the instant t1 the drive signal returns to low and the turn-on interval, i.e. of conduction of the switch, ends (interval Ton=t1-t0).

If the switch 7A or 7B closes correctly, the fault signal S2 on the fault line (9A or 9B) remains low, i.e. there is no signal. The fault signal S3 on the fault terminal of the DPS remains unchanged.

FIG. 3(B) shows a situation in which there is a fault in the electronic switch 7A or 7B. The curve S1 still has the same shape described with reference to FIG. 3(A). A fault occurs on the electronic switch 7A or 7B at the instant t2. This causes the generation of a fault signal S2. The voltage on the fault line 9A or 9B changes from a low value to a high value. This signal on the fault line 9A or 9B is detected by the DSP 1, which generates a fault signal S3 on the fault terminal of the DSP at the instant t3.

In a device according to the state of the art, if the drive signal S1 does not reach the driver circuit (5A or 5B), no fault signal is generated and the DSP 1 is not able to detect this fault.

Figure 2:
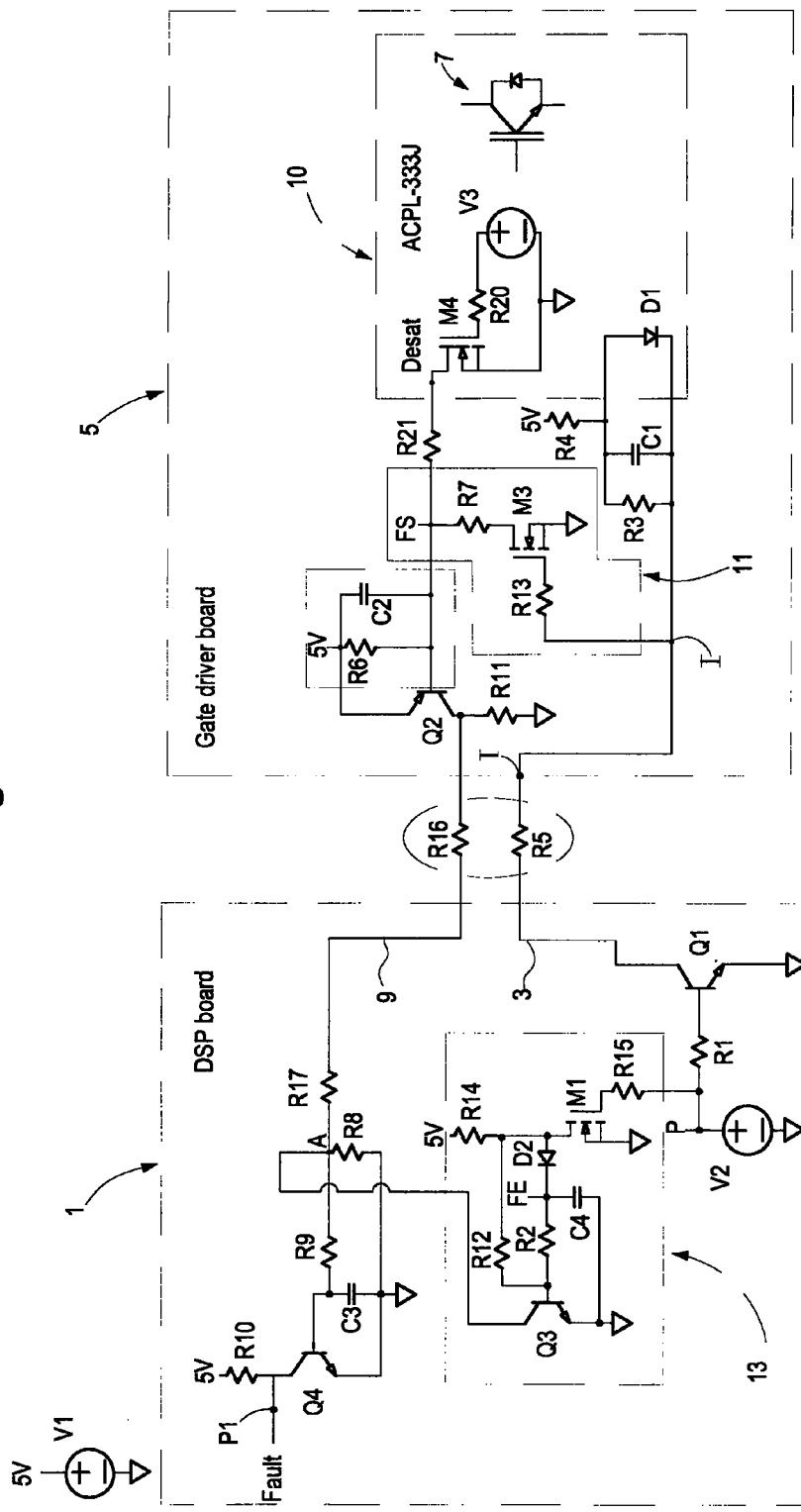
FIG. 2 shows a circuit diagram of a drive signal processing circuit and of a driver circuit of one of the driven electronic switches.

FIG. 2 illustrates a circuit diagram with the components of the DSP 1 and of one of the driver circuits of one of the electronic switches 5A, 5B connected to the DSP 1 in an embodiment of the subject disclosed herein, which allow the generation of a fault signal even when the drive signal does not reach the respective driver circuit 5A, 5B, for example due to an interruption on the respective drive line 3A or 3B.

The diagram and the description below illustrate the components required to understand the invention. Those skilled in the art will understand that further components, devices, circuits or elements can be provided in combination with those illustrated and described below, for example to perform functions known in the art.

In FIG. 2 the reference numeral 1 again indicates the drive signal processing circuit, hereinafter once again indicated with DSP, for the sake of brevity. In the description of the circuit solution of FIG. 2, some lumped electronic components, typically capacitors and resistors, will be indicated. Those skilled in the art will understand that each of these components can in some cases be replaced by a plurality of components in series and/or in parallel, or that some of these components represented as concentrated elements can actually be formed by distributed elements, for example by distributed resistors or capacitors.

The circuit components described herein refer to one of the paralleled electronic switches 7A, 7B. It must be understood that a similar arrangement is provided for each of the electronic switches driven by the DSP circuit 1.

The DSP contains components for the generation of a drive signal. In the diagram of FIG. 2, a voltage source V2 represents the generator of the drive signal, for example a PWM signal. The drive signal is applied at the base of a transistor Q1, for example an NPN switching transistor. R1 indicates a resistor between the positive terminal (point P) of the drive signal source V2 and the gate or base of the transistor Q1. The negative terminal of the source V2 is connected to ground. The emitter of the transistor Q1 is also connected to ground, while the collector is connected to the drive line, indicated here with 3. R5 schematically represents the resistor of the cable forming the drive line 3.

The drive signal is transmitted to the driver circuit, indicated here with 5. In some embodiments, the driver circuit 5 can comprise a photodiode D1 that galvanically isolates the driver circuit 5 from the electronic switch, generically and schematically indicated with 7. The photodiode D1 can be part of a commercially available photocoupler circuit 10, for example an ACPL-333J circuit, which on the one hand provides optical coupling and on the other transfers a fault signal to the driver circuit in the case of malfunction of the electronic switch 7. Clearly, other photocoupler circuits that provide similar or equivalent functions can be used.

In the diagram of FIG. 2, the photodiode D1 is connected between the drive line 3 and a high voltage point, in the example 5V, of the driver circuit. R4 indicates the resistor between the photodiode D1 and the connection point to the 5V voltage. A resistor R3 and a capacitor C1 can be provided in parallel to the photodiode D1.

In the simplified diagram of FIG. 2, V3 indicates a voltage source that simulates the fault signal of the switch 7. If a voltage drop exceeding a threshold value occurs across the electronic switch 7, the photocoupler circuit 10 generates a fault signal on the terminal indicated with Desat. The fault signal is represented by a voltage pulse applied at the gate of a transistor M4, for example an N-Channel Logic Level Enhancement Mode Field Effect Transistor or other suitable electronic switch, which consequently closes, bringing the voltage at the terminal Desat to a low value.

The terminal Desat is connected, for example, via a resistor R21, at the base of a transistor Q2, for example a PNP switching transistor. In the diagram of FIG. 2, the collector of the transistor Q2 is connected to ground, for example through a resistor R11, and to the fault line, indicated schematically here with 9. The emitter of the transistor Q2 is connected to the high voltage (5V) of the circuit. Between the base and the emitter of the transistor Q2 a delay network can be provided, for example comprising a capacitor C2 and a resistor R6 in parallel.

On the side of the DSP 1, the fault line 9 is connected to the base of a transistor Q4, for example an NPN switching transistor. Between the fault line 9 and the base of the transistor Q4 there are indicated two resistors R9 and R17, between which an intermediate point is provided, indicated with A, to which a resistor R8 is connected, which connects the point A to ground. A capacitor C3 can be arranged between ground and the base of the transistor Q4.

The collector of the transistor Q4 is connected, via a resistor R10, to the high voltage (5V), while the emitter of the transistor Q4 is connected to ground. When a fault signal (high signal, 5V) is present on the fault line 9, the transistor Q4 enters into conduction with a certain delay, caused by the delay network R8, R9, C3, generating a low signal on the point P1, or fault terminal, of the DSP 1. When this occurs, the circuit is deactivated and/or an alarm is emitted.

To allow the DSP 1 to receive a fault signal also in the case in which the drive signal generated by the source V2 does not reach the driver circuit 5, for example due to a fault or an interruption on the drive line 3, on the drive circuit 5 a circuit arrangement is provided, indicated generically and as a whole with 11, which generates a fault signal on the fault line 9 each time the signal on the drive line is low, i.e. when the signal on the drive line 3 seen by the driver circuit 5 is an opening signal, i.e. turn-off signal for the electronic switch 7. Vice versa, on the DSP 1 a circuit arrangement is provided, indicated generically with 13, that inhibits or masks the fault signal coming from the fault line 9 during the turn-off intervals of the drive signal generated by the source V2.

More in particular, the circuit arrangement 11 can comprise a branch that connects the drive signal input I on the driver circuit 5 to the base of the transistor Q2. This connection branch brings the voltage on the base of the transistor Q2 to a low value during each turn-off interval of the drive signal and also in the case in which no drive signal is present at the drive signal input I on the driver circuit 5, for example due to a fault or accidental disconnection of the drive line 3. In the embodiment illustrated, the voltage value of the base of the transistor Q2 is set by the two resistors R6 and R7 and is such as to ensure the switching of Q2.

For this purpose, in a possible embodiment the circuit arrangement 11 can comprise an electronic switch M3, for example an N-Channel Logic Level Enhancement Mode Field Effect Transistor, the emitter of which is connected to ground and the collector of which is connected, in the point indicated with FS, to the base of the transistor Q2. R7 indicates a resistor between the collector of the transistor M4 and the base of the transistor Q2. The gate of the transistor M4 is connected to the drive signal input terminal I on the driver circuit 5.

The circuit arrangement 13 on the DSP 1 is connected between an intermediate point (indicated with A) between the resistors R17 and R9 and positive terminal (point P) of the source V2 that represents the generator of the drive signal.

In some embodiments, the circuit arrangement 13 can comprise a transistor M1, for example an N-Channel Logic Level Enhancement Mode Field Effect Transistor, the gate of which is connected, via a resistor R15, to the point P of the source V2 of the drive signal. The emitter of the transistor M1 is connected to ground. The collector of the transistor M1 is connected, via a resistor R14, to the high voltage (5V).

The collector of the transistor M1 can also be connected, through a delay network, to the base of a further transistor Q3, for example an NPN switching transistor. The connection between the transistors M12 and Q3 can comprise, for example, a diode D2 and a resistor R2 arranged in series. A resistor R12 can be provided in parallel to the branch containing the diode D2 and the resistor R2. A capacitor C4 is interposed between an intermediate point FE, between the diode D2 and the resistor R2, and ground. The components R2, R12, C4 form the delay network.

The emitter of the transistor Q3 is connected to ground, while the collector is connected to the point A, between the resistors R17 and R9 that connect the fault line 9 to the base of the transistor Q4.

The circuit described in the foregoing functions as follows.

Let us suppose initially that the whole circuit (including the electronic switch 7 and the drive line 3) are operating correctly. In the point P the source V2 generates a drive signal, for example a PWM signal, that can be formed by a sequence of turn-on (Ton) and turn-off (Toff) intervals, to which closing and opening intervals of the switch 7 correspond. The turn-off interval (Toff) corresponds to the interval during which the voltage at point P is low (at ground value). The turn-on interval (Ton) corresponds to the interval during which the voltage at point P is high (5V in the example). Via opening and closing of the transistor Q1 caused by the voltage value applied at the base thereof, the drive signal is transferred to the drive line 3 and therefore to the photodiode D1.

During the turn-off interval the voltage on the drive line 3 is high, as the transistor Q1 is non-conducting and the point I of the drive circuit is connected to the high voltage (5V) via the network R4, R3, C1. The photodiode D1 does not conduct and therefore the switch 7 is non-conducting, i.e. in open condition (OFF).

The high voltage of point I is also applied, via the resistor R13, to the gate of the transistor M3, which is therefore conducting (switch closed). This brings the voltage at the base of the transistor Q2 to ground. As the transistor Q2 is of PNP type, it enters into conduction. The voltage on the fault line 9 is brought to the high value (5V). Therefore, a high signal is present during each opening interval (Toff) of the switch 7 on the fault line 9.

A high voltage signal on the fault line 9 indicates the presence of a fault. However, in the situation considered here, the device is in actual fact operating correctly. On the DSP the fault signal coming from the fault line 9 during the turn-off interval of the electronic switch 7 must be masked or inhibited. This takes place via the circuit arrangement 13 described above, which operates as follows. The low voltage at point P causes the switch M1 to non-conducting and therefore the base of the transistor Q3 is brought to the value of 5V. The transistor Q3 therefore enters into conduction and connects point A to ground. In this way the base of the transistor Q4 does not "see" the high voltage on the fault line 9 and therefore in substance reads a condition of correct operation. The transistor Q4 remains non-conducting, i.e. open, and a 5V voltage is present at point P1 (fault terminal of the DSP 1), which indicates correct operation (absence of fault) of the driver circuit.

Summarizing, reading of the signal on the fault line 9 is inhibited or masked during each turn-off interval (Toff) of the drive signal.

During the conduction, i.e. turn-on, interval (Ton interval), the signal in the point P generated by the source V2 is brought to the high level (5V in the example). Consequently, the transistor Q1 closes and connects the drive line 3 to ground. The low voltage in the drive signal input point I on the driver circuit 5 biases the photodiode D1 into conduction, which consequently closes the switch 7 via the photocoupler 10.

The low voltage at point I causes the transistor M3 to open. The connection point FS to the base of the transistor Q2 remains isolated from ground and connected to the 5V voltage and to the terminal Desat of the photocoupler 10. With a delay imparted by the delay network C2, R6, switching of the transistor M3 causes the transistor Q2 to open. A low voltage signal appears on the fault line 9, as opening of the transistor Q2 has isolated the fault line 9 from the 5V voltage and the fault line 9 remains connected to the ground line via resistor R11. The signal on the fault line 9 goes to the low value (no fault). As will be clarified below, the transistor Q2 is returned to conduction by a possible fault signal coming from the photocoupler 10.

The low voltage signal on the fault line 9 is interpreted by the DSP 1 as a condition of correct operation. The transistor Q4 is non-conducting and the 5V voltage is present at point P1 on the fault terminal. The branch that connects point A to point P, i.e. the circuit arrangement 13, is interrupted, as the voltage at the high value at point P biases the transistor M1 into conduction and therefore causes the transistor Q3 to open. The point A is therefore isolated from ground. The circuit arrangement 13 is inactive. The delay network R12, R2, C4 ensures that opening of the transistor Q3 is delayed with respect to switching of the drive signal.

The mechanism described above is represented by the waveforms indicated in FIG. 4(A), where the voltage is indicated on the ordinates and the time is indicated on the abscissas. The curve S1 represents the drive signal coming from the source V2 and S2 represents the fault signal on the fault line 9. During the turn-on intervals (signal S1 high), the fault signal (S2) is low, indicating correct operation of the device. During the turn-off intervals (signal S1 low), the fault signal on the line 9 is at the high value. However, due to masking of the fault signal, obtained during the turn-off intervals via the circuit arrangement 13 as described above, the signal S3 on the fault terminal remains at constant value (high), indicating correct operation of the drive circuit 5 and of the switch 7.

The behavior of the circuit in the case, in which the drive line 3 is interrupted, i.e. in the case in which no drive signal reaches the electronic switch 7, is described below. As previously stated, a situation of this type can lead to a fault of the electronic switch caused by exceeding the current rating. Therefore, if an interruption occurs on the drive line 3, the DSP 1 must receive a fault signal to switch off the device and/or provide an alarm signal.

If the drive line 3 is not connected to the driver circuit 5, the turn-on signal will not reach the input I of this latter. Therefore, the voltage at point I always remains at the high value and the transistor M3 does not open and remains conductive. Point FS remains connected to ground. Consequently, the transistor Q2 remains in conduction. The signal S2 on the fault line 9 remains at a constant value (high) during the conduction intervals (Ton), as shown in FIG. 4(B).

As described above, during the conduction intervals Ton, the circuit arrangement 13 is not active, i.e. does not mask the fault signal, as the transistor Q3 is non-conducting. Therefore, the high signal on the fault line 9 (indicating the presence of a fault) causes closing of the transistor Q4 and therefore generation of an alarm signal S3 on the fault terminal of the DSP 1. In FIG. 4(B) this situation is represented by the square wave shape of the signal S3.

Figure 5:
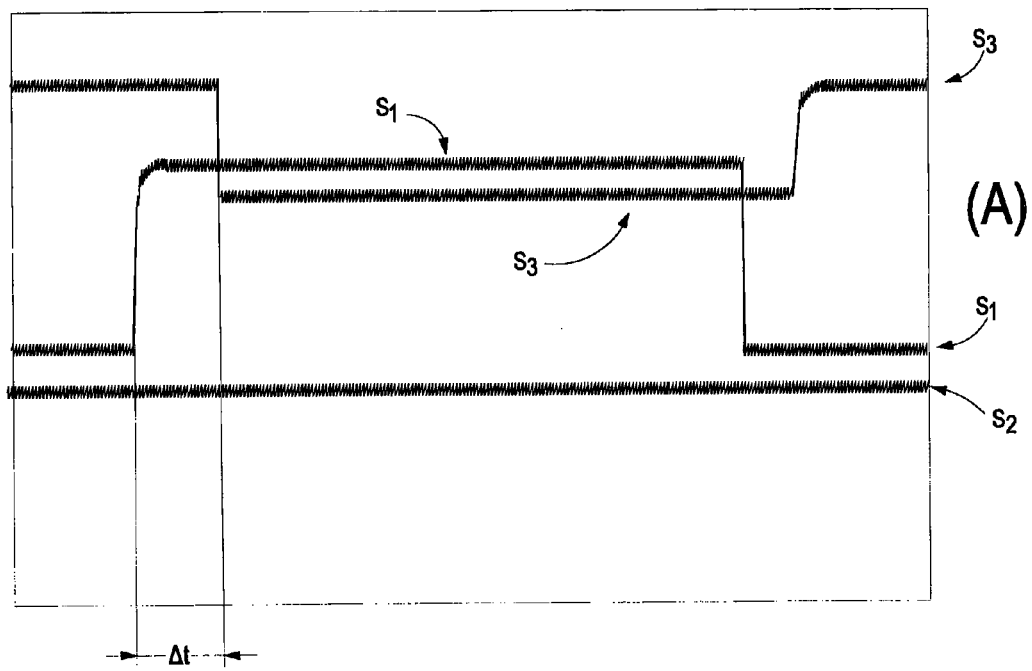
Figure 5:
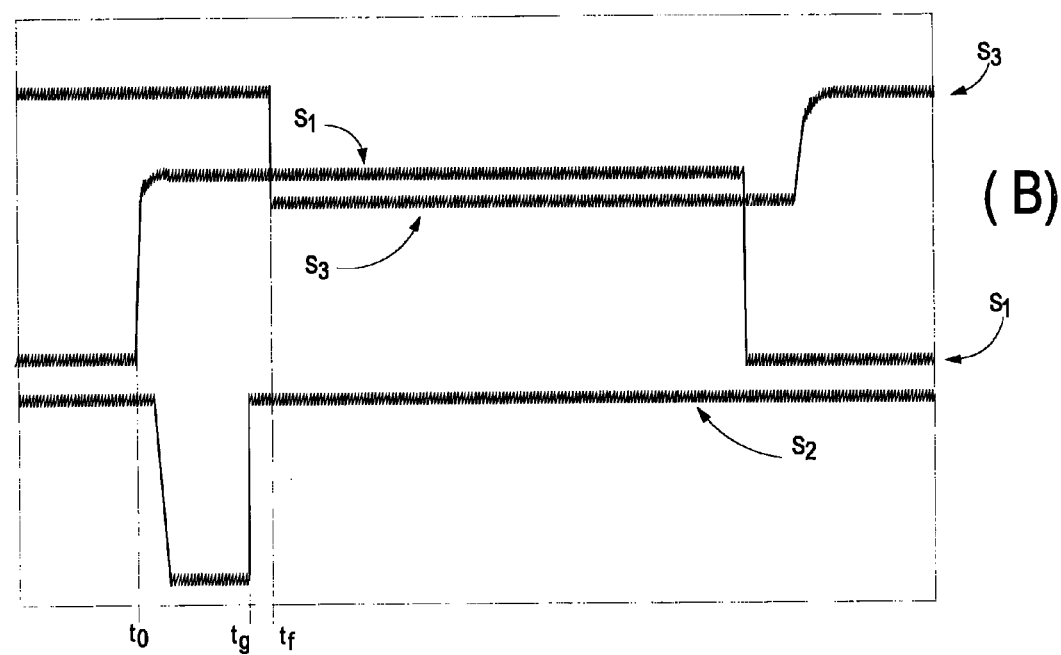

FIG. 5(A) shows an enlargement of a portion of the diagram of FIG. 4(B). It can be noted that the fault signal S3 is activated with a time delay $\Delta t$ with respect to the rising edge of the drive signal S1, due to the delay introduced by the delay network R2, R12, C4.

Therefore, the circuit described is able to detect and signal a fault deriving from failure to receive the drive signal on the driver circuit 5 of the switch 7. In this way, it is possible to deactivate the device in a situation of absence of drive signal on one or more of the paralleled switches 7 (7A, 7B), preventing situations of overload from occurring on the switches that continue to receive the drive signal correctly.

The circuit described also allows a fault to be detected on the electronic switch 7 in substantially the same way as prior art circuits. If an excessive drop in voltage, indicative of a fault on the switch, occurs across the switch 7, this brings the voltage at the terminal Desat of the photocoupler 10 to the low value following closing of the transistor M4. The voltage at point FS goes to ground and this biases the transistor Q4 into conduction. A high voltage (5V) signal is generated on the fault line 9, causing generation of the fault signal on the fault terminal of the DSP 1.

FIG. 5(B) again indicates the signals S1, S2, S3 as defined above in a situation of fault of the switch 7. The rising edge of the drive signal generated by the source V2 is present at the instant t0. As the signal is in this case received correctly by the driver circuit 5 (drive line 3 operating correctly), the fault signal S2 on the fault line 9 goes to the low value. A fault occurs on the driver circuit or on the switch 7 at the instant tg. This brings the fault signal S2 back to the high value (5V). With a time delay (tf–tg) switching of the fault signal S2 is detected by the DSP via closing of the transistor Q4 and consequent switching from the high value to the low value of the signal S3 on the fault terminal of the DSP 1 at the instant tf.

While embodiments of the subject disclosed herein have been shown in the drawings and described fully in the foregoing with particulars and details in relation to different exemplary embodiments, those skilled in the art will understand that many modifications, changes and omissions are possible without materially departing from the innovative teachings, from the principles and from the concepts set forth above, and from the advantages of the subject defined in the appended claims. Therefore, the effective scope of the innovations described must be determined only based on the broadest interpretation of the appended claims, so as to comprise all modifications, changes and omissions. Moreover, the order or sequence of any method or process step can be varied or rearranged according to alternative embodiments.

The invention claimed is:

1. A device for driving paralleled electronic switches, comprising:

a drive signal processing circuit configured to send a drive signal to a plurality of parallel electronic switches, the drive signal having at least a turn-on value and a turn-off value;

a driver circuit for each of the plurality of electronic switches, each driver circuit configured to receive the drive signal from the drive signal processing circuit and control closing and opening of a respective electronic switch as a function of the value of the drive signal;

a drive line configured to transmit the drive signal from an output of the drive signal processing circuit to an input of a respective driver circuit;

a fault line configured to transmit a fault signal from the respective driver circuit to the drive signal processing circuit;

wherein each driver circuit is configured to generate a fault signal on the fault line when the drive signal input to the driver circuit assumes the turn-off value, and when there is a fault in the respective electronic switch; and wherein the drive signal processing circuit is configured to mask the fault signal from the respective driver circuit during intervals in which the drive signal output from the drive signal processing circuit assumes the turn-off value.

2. The device according to claim 1, wherein:

the driver circuit comprises a fault signal generating circuit including an electronic changeover switch, connected to the fault line, configured and driven so as to switch the voltage on the fault line such that the voltage on the fault line is equal to a value indicative of a fault situation when the drive signal input to the driver circuit assumes the turn-off value, or when there is a fault in the respective electronic switch, and the voltage on the fault line is equal to a value indicative of a correct operating situation when the drive signal input to the driver circuit assumes the turn-on value and the electronic switch is operating correctly.

3. The device according to claim 2, wherein the drive signal processing circuit further comprises a delay network configured to delay switching of the electronic changeover switch with respect to a rising edge of the drive signal.

4. The device according to claim 3, wherein the electronic changeover switch is configured to apply on the fault line a high voltage value indicative of a fault signal, or a low voltage value, indicative of the absence of a fault.

5. The device according to claim 4, wherein the fault signal generating circuit comprises a connection branch, which connects the drive signal input of the driver circuit to the electronic changeover switch, so that the voltage value on the drive signal input acts on the switching state of the electronic changeover switch.

6. The device according to claim 3, wherein the fault signal generating circuit comprises a connection branch, which connects the drive signal input of the driver circuit to the electronic changeover switch, so that the voltage value on the drive signal input acts on the switching state of the electronic changeover switch.

7. The device according to claim 6, wherein the connection branch comprises a switch configured to close when the drive signal assumes the turn-off value and to open when the drive signal assumes the turn-on value.

8. The device according to claim 2, wherein the electronic changeover switch is configured to apply on the fault line a high voltage value indicative of a fault signal and a low voltage value indicative of the absence of a fault.

9. The device according to claim 8, wherein the fault signal generating circuit comprises a connection branch, which connects the drive signal input of the driver circuit to the electronic changeover switch, so that the voltage value on the drive signal input acts on the switching state of the electronic changeover switch.

10. The device according to claim 2, wherein the fault signal generating circuit comprises a connection branch configured to couple the drive signal input of the driver circuit to the electronic changeover switch so that the voltage value on the drive signal input acts on the switching state of the electronic changeover switch.

11. The device according to claim 10, wherein the connection branch comprises a switch which is configured to close when the drive signal assumes the turn-off value and to open when the drive signal assumes the turn-on value.

12. The device according to claim 11, wherein the switch of the connection branch is arranged and configured to apply a low voltage at the base of the changeover switch of the fault signal generating circuit when the drive signal assumes the turn-off value, the low voltage causing closing of the electronic changeover switch and application of a fault signal on the fault line.

13. The device according to claim 2, wherein the electronic changeover switch is coupled to a fault signal input of the electronic switch driven by the driver circuit, the fault signal of the electronic switch causing switching of the electronic changeover switch of the fault signal generating circuit such as to apply a fault signal to the fault line.

14. The device according to claim 1, wherein a fault condition of the electronic switch is detected via an overvoltage signal across the electronic switch.

15. The device according to claim 1, wherein:

the drive signal processing circuit comprises a terminal connected to the fault line via a fault signaling changeover switch;

the fault signaling changeover switch is configured to have a switching state determined by the presence or absence of a fault signal on the fault line; and wherein the drive signal processing circuit is further configured to mask the fault signal sent by the fault line to the fault signaling changeover switch when the drive signal assumes the turn-off value.

16. The device according to claim 15 further comprising a fault signal inhibition circuit, and wherein:

the fault signaling changeover switch comprises a gate connected to a node connected to the fault line and to the fault signal inhibition circuit which is configured to bring the node to a voltage value corresponding to an absence of fault signal during the intervals in which the drive signal assumes the turn-off value.

17. The device according to claim 16, wherein the fault signal inhibition circuit comprises an arrangement of electronic switches configured to bring the node to a low voltage value during the intervals in which the drive signal assumes the turn-off value.

18. The device according to claim 17, wherein the fault signal inhibition circuit comprises a delay network configured to prolong an inhibition effect of the circuit with respect to the switching edge of the drive signal from the turn-off value to the turn-on value.

19. The device according to claim 16, wherein the fault signal inhibition circuit further comprises a delay network configured to prolong an inhibition effect of the fault signal inhibition circuit with respect to the switching edge of the drive signal from the turn-off value to the turn-on value.

20. The device according to claim 1, wherein the drive signal comprises a PWM signal.

21. A method for driving paralleled electronic switches via a drive signal processing circuit connected to respective driver circuits associated with the electronic switches, the method comprising:
- during the turn-off intervals of each of the electronic switches, and when there is a fault in the respective electronic switch, the driver circuit sends a respective fault signal of the electronic switch to the drive signal processing circuit; and
- during the turn-off intervals of the electronic switch, the drive signal processing circuit masks the fault signal coming from the driver circuit of the electronic switch.

* * * * *